United States Patent [19]

Koomen

[11] Patent Number: 4,461,963
[45] Date of Patent: Jul. 24, 1984

[54] MOS POWER-ON RESET CIRCUIT

[75] Inventor: Joannes J. M. Koomen, Eekhoornlaan, Netherlands

[73] Assignee: Signetics Corporation, Sunnyvale, Calif.

[21] Appl. No.: 338,785

[22] Filed: Jan. 11, 1982

[51] Int. Cl.³ ............ H03K 17/22; H03K 17/30; H03K 17/687; H03K 3/356
[52] U.S. Cl. .................. 307/279; 307/200 B; 307/290; 307/581
[58] Field of Search ............ 307/200 A, 200 B, 443, 307/491, 501, 354, 363, 574, 581, 279, 290, 593, 594, 296 R

[56] References Cited

U.S. PATENT DOCUMENTS

| | | | |
|---|---|---|---|
| 3,895,239 | 7/1975 | Alaspa | 307/594 |
| 4,048,524 | 9/1977 | Laugesen et al. | 307/290 X |
| 4,196,362 | 4/1980 | Maehashi | 307/279 X |
| 4,296,338 | 10/1981 | Thomas | 307/594 X |
| 4,296,340 | 10/1981 | Horan | 307/279 X |
| 4,297,596 | 10/1981 | Eckert | 307/279 |

Primary Examiner—Larry N. Anagnos
Assistant Examiner—David R. Hudspeth
Attorney, Agent, or Firm—J. A. Dinardo; R. J. Meetin; R. Mayer

[57] ABSTRACT

A MOS power-on reset circuit includes Schmitt trigger circuit and an inverter. The Schmitt trigger circuit comprises first, second, and third depletion transistors serially connected between reference potential and supply voltage. The first and second depletion transistors are connected at a first junction point, and the second and third depletion transistors are connected at a second junction point. The gates of the first and second depletion transistors are commonly connected for receiving an input substrate bias voltage. An enhancement transistor is connected between the first junction point and supply voltage. The gates of the enhancement transistor and the third depletion transistor are commonly connected to the second junction point, which is the output of the Schmitt trigger circuit and which is coupled to the inverter from which the output voltage is taken. The transfer characteristic of the circuit exhibits hysteresis, with two trigger levels of input substrate bias voltage that differ sufficiently in magnitude that a triggering at one level, accompanied by a fluctuation in input voltage, will not cause a spurious triggering at the other level. Undesired oscillation of the circuit is thereby avoided.

12 Claims, 4 Drawing Figures

MOS POWER-ON RESET CIRCUIT

BACKGROUND OF THE INVENTION

This invention relates to a protective circuit for MOS integrated circuits. More particularly, for an integrated circuit having a P type substrate and vice versa for an integrated circuit having an N type substrate, this invention relates to a power-on reset circuit that will provide an output signal roughly equal to the power supply voltage unless the P substrate voltage has a sufficiently large negative voltage and that will reset its output voltage to the reference ground potential when the P substrate bias voltage has reached a sufficiently large negative voltage value.

A substrate bias voltage is used in many MOS circuits to back bias and thereby render non-conductive diodes and parasitic (field) transistors. However, when a circuit is first powered on, due to capacitive coupling to the substrate and due to inherent circuit delay in establishing the substrate bias voltage, the diodes and parasitic (field) transistors may, in fact, become forward biased and conducting for a time before the substrate back bias voltage has reached its normal operating value. The temporary forward biasing of the P substrate causes the threshold voltage of the MOS circuit transistors temporarily to drop to substantially lower values. Moreover the states of the input voltages of the various circuits are not yet finally defined. As a result of this and even more effectuated by the temporary lower threshold, large short circuit currents (for example through the output stages of push-pull circuits like buffers or clocks) could damage the integrated circuit or blow out the power supply fuse.

The output voltage of the protective circuit can be used firstly to inhibit the precharge of N+ areas during power on and thereby avoid forward biasing of the P substrate, and secondly to immediately define the input states of important and major circuits in order to prevent large short circuit currents through these circuits.

SUMMARY OF THE INVENTION

In accordance with the invention, a MOS power-on reset circuit includess a Schmitt trigger circuit whose input is a substrate bias voltage and whose output is coupled to an inverter circuit to produce the desired power on reset voltage having a hysteresis characteristic of the desired polarity. In one embodiment of the invention the Schmitt trigger circuit comprises first, second and third depletion transistors connected in series in that order across a point of reference potential and a point of supply potential. The first and second transistors are connected at a first junction point and the second and third transistors are connected at a second junction point. The gates of the first and second transistors are coupled together to an input terminal for receiving the input substrate bias voltage. A first enhancement transistor is coupled between the first junction point and the point of supply potential. The gate of the enhancement transistor and the gate of the third depletion transistor are coupled to the second junction point. The second junction point, which is the output of the Schmitt trigger circuit, is coupled to the inverter to produce the desired power-on reset voltage at the output of the inverter.

The desired voltage output plotted against the input substrate bias voltage has a hysteresis characteristic owing to two different trigger levels of the input voltage. The two trigger levels are sufficiently widely separated in voltage difference that a triggering at one level of input substrate bias voltage, accompanied by a fluctuation in the input substrate bias voltage about that level, will not cause an unwanted triggering at the other input voltage level. Oscillation in the trigger circuit is thereby avoided. The circuit of the invention does not require any external timing between the application of the power supply and substrate back bias voltages on the MOS circuits it is intended to protect, and it consumes very little standby power.

DESCRIPTION OF THE PREFERRED EMBODIMENTS

Figure 1:
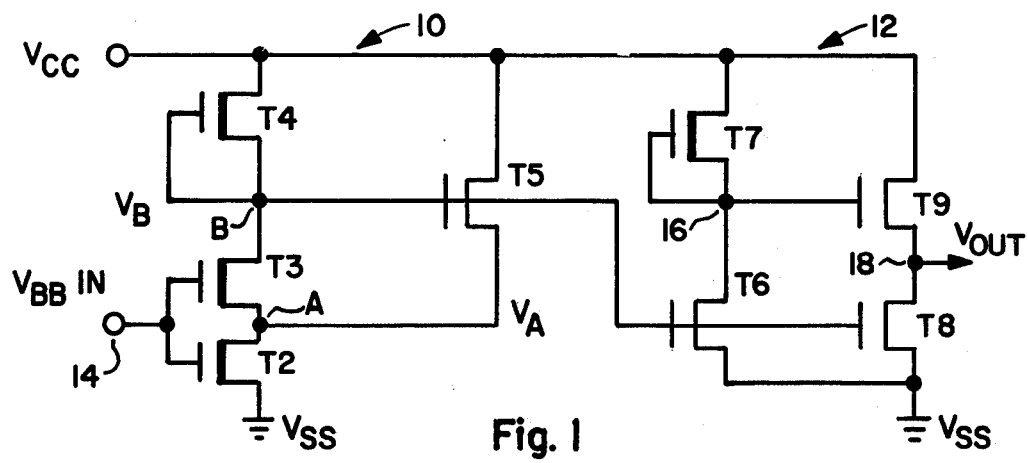
FIG. 1 is a schematic drawing of one embodiment of the MOS power-on reset circuit according to the invention.

FIG. 1 is a schematic diagram of an MOS power-on reset circuit according to the invention. The circuit is illustrated for an N-channel implementation where a P type substrate and N type source and drain regions are used. For P-channel implementation, the operating voltages are opposite in polarity. The circuit comprises a Schmitt trigger circuit 10 where the input is applied, and an inverter circuit 12 from which the output is taken. In the Schmitt trigger circuit 10 three depletion transistors T2, T3 and T4 are serially connected between a point of reference potential $V_{SS}$ such as ground and a point of supply potential $V_{CC}$. The first and second transistors T2 and T3 are serially connected at a first junction point A and the second and third transistors T3 and T4 are serially connected at a second junction point B. The gates of the first and second transistors T2 and T3 are connected together to an input terminal 14 for receiving an input substrate bias voltage $V_{BB}$. A first enhancement transistor T5 is coupled between the first junction point A and the point of supply potential $V_{CC}$. The gates of transistors T4 and T5 are commonly connected to the second junction point B, where the output of the Schmitt trigger circuit 10 appears. Transistor T4 is small in size relative to transistors T2, T3 and T5.

Transistor T4 does not necessarily have to be of the depletion type. Transistor T4 can also be of the enhancement type. However in that case the source would be connected to the second junction point B while both the drain and gate would be connected to the power supply. Only the maximum level of the voltage $V_B$ at junction point B will be lowered, and otherwise the circuit operation will be similar.

The output of the Schmitt trigger circuit appearing at junction point B is coupled to the input of the inverter circuit 12. The inverter input consists of the commonly connected gates of second and third enhancement transistors T6 and T8. The second enhancement transistor T6 is connected in series with a fourth depletion transistor T7 at a third junction point 16 between the point of reference potential $V_{SS}$ and the point of supply potential $V_{CC}$. The third enhancement transistor T8 is serially connected at a fourth junction point 18 with a fourth enhancement transistor T9 across the point of reference potential $V_{SS}$ and the point of supply potential $V_{CC}$. The gates of transistors T7 and T9 are commonly connected to the third junction point 16. The output voltage may be taken from the fourth junction point 18, as shown, or from the third junction point 16.

The configuration of the inverter 12 is merely one form of inverter that can be used. Any other suitable form of MOST inverter can be used to perform the same function.

Figure 2:
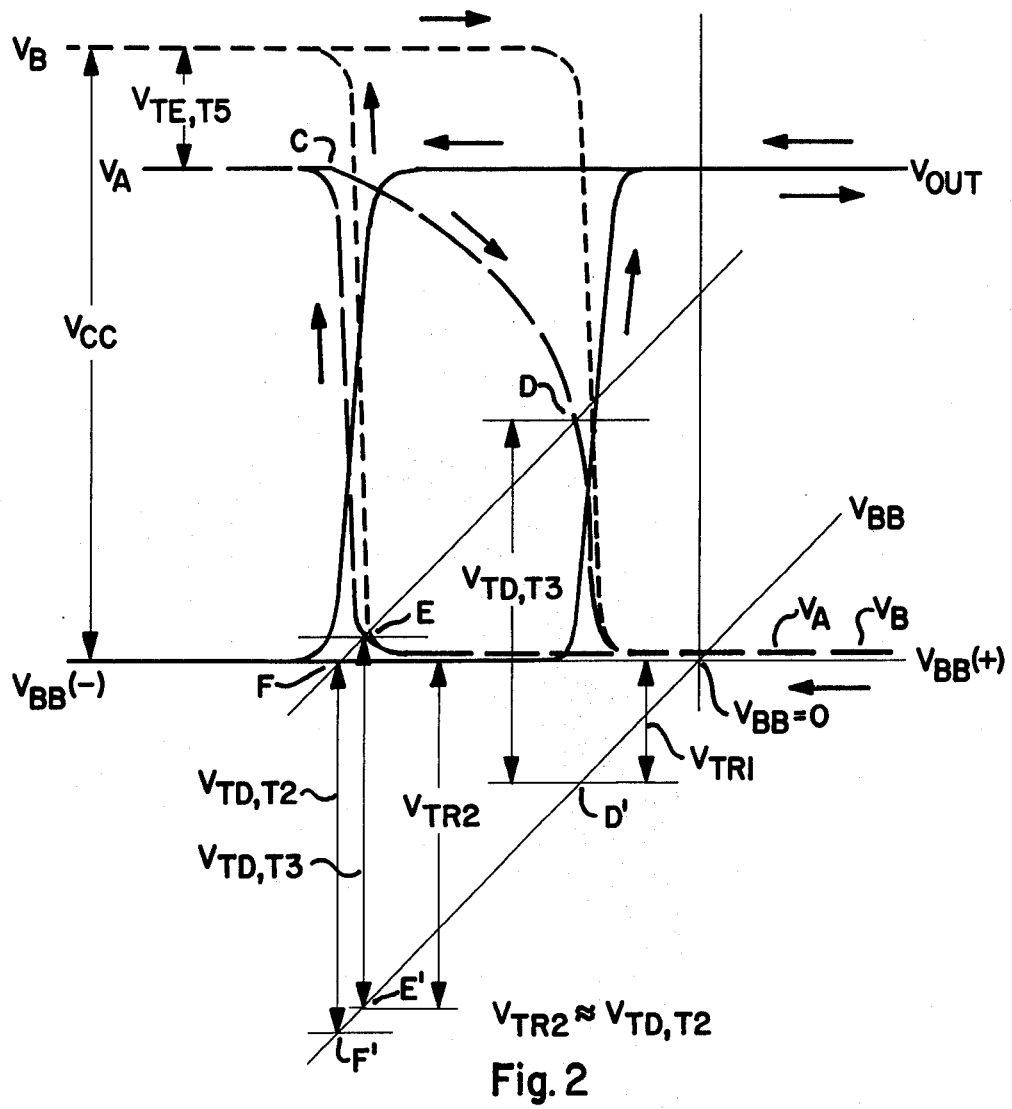
FIG. 2 is a voltage transfer diagram of the circuit of FIG. 1.

In FIG. 2, the voltage $V_A$ at junction point A of FIG. 1 is shown as a broken line, the voltage $V_B$ at junction point B is shown as a dashed line, and the output voltage $V_{out}$ is shown as a solid line.

In operating the circuit of FIG. 1 the voltage supply $V_{CC}$ is a positive DC value and the substrate bias voltage $V_{BB}$ is negative in polarity. The operation of the circuit will be described with the aid of the transfer diagram shown in FIG. 2. Suppose the input substrate bias voltage $V_{BB}$ is less than or equal to the threshold voltage $V_{TD,T2}$ of depletion transistor T2. Under this condition, transistors T2, T3 and T5 are non-conducting, while transistor T4 is always conducting. Therefore, the voltage $V_B$ at junction point B is equal to the supply voltage $V_{CC}$, and the voltage $V_A$ at the junction point A is equal to the supply voltage $V_{CC}$ minus the threshold voltage $V_{TE,T5}$ of transistor T5. The threshold voltage of the depletion transistors is a negative value, and the threshold voltage of the enhancement transistors is a positive value. The initial condition so far described is that shown in the extreme lefthand portion of FIG. 2.

Now suppose the input substrate bias voltage $V_{BB}$ moves in the direction from left to right along the horizontal axis. When $V_{BB}$ approaches the threshold voltage $V_{TD,T2}$, transistors T2 starts to conduct and tries to pull down the voltage $V_A$ at junction point A. Transistor T5 becomes conducting and tries to prevent the voltage $V_A$ from being pulled down by transistor T2. Transistor T3 is still non-conducting, so the voltage $V_A$ at junction point A is determined by the state of transistor T2 and of transistor T5. As the input voltage $V_{BB}$ increases in a positive direction, the voltage $V_A$ gradually falls, as shown to the right of point C, while the voltage $V_B$ at junction point B maintains its original level. This condition occurs at the voltage level shown at point F' on the inclined line $V_{BB}$ representing the substrate bias potential. The vertical distance FF' between point F' and the horizontal axis represents the threshold voltage $V_{TD,T2}$ and is in the same horizontal position as point C on curve $V_A$.

When the input voltage $V_{BB}$ has increased in value so much that $V_{BB} - V_{TD,T3} - V_A \geq 0$, transistor T3 conducts and immediately pulls $V_B$ down to ground potential because the current through transistor T4 is negligibly small. This condition occurs at the voltage level shown at point D' on the inclined line $V_{BB}$ representing the substrate bias potential. The length of the vertical line intersecting point D' and point D on curve $V_A$ represents the threshold voltage $V_{TD,D3}$ of transistor T3, and the vertical distance between D' and the horizontal axis represents the first trigger voltage level $V_{TR1}$, or the value of the substrate bias voltage $V_{BB}$ at the first trigger level. As a result of the voltage $V_B$ dropping to near ground potential, transistor T5 goes into the non-conductive state and also the voltage $V_A$ goes from point D to near ground potential. The value of the first trigger voltage level $T_{TR1}$ is determined by the threshold of transistor T3 and the thresholds and geometries of transistors T2 and T5 only.

As the substrate bias voltage $V_{BB}$ moves further to the right in a more positive direction, both the voltages $V_A$ and $V_B$ will be near ground potential and transistor T5 will remain in a non-conductive state. It is noted that the output voltage waveform $V_{out}$ is the inverse of the waveform of the voltage $V_B$, increasing to a level equal to the voltage $V_A$ while the voltage $V_B$ is dropping toward ground potential.

The depletion transistor T4 need not be negligibly small with respect to depletion transistors T2 and T3. Here this transistor T4 is taken negligibly small for the sake of a simpler explanation and description of the power-on reset circuit. In fact, in a real power-on reset circuit transistor T4 should be so small that at input voltages $V_{BB}$ to the left of the trigger level ($V_{TR1}$ or $V_{TR2}$, see FIGS. 2 and 4) the Schmitt trigger voltage $V_B$ is below the threshold voltage $V_{TE,6-8}$ of inverter transistors T6 and T8.

A further effect of a not negligibly small size of transistor T4 is that both the trigger levels are shifted slightly to the right because now transistors T3 and T2 have also to drive the current through transistor T4. This does not hinder the circuit operation nor narrow the application. So for the sake of an easier and simpler explanation and description transistor T4 will be taken to be negligibly small.

The larger the size of the enhancement transistor T5, the more the input voltage $V_{BB}$ for the first trigger level $V_{TR1}$ will be shifted towards the positive direction and can in fact also assume positive values. Thus, the points D and D' are moved further to the right as the size of transistor T5 is increased.

Now it is necessary to make the reverse excursion of $V_{BB}$ by moving the substrate bias voltage in the more negative direction from right to left in the diagram of FIG. 2. For $V_B - V_{TE,T5} - V_A \leq 0$, transistors T4, T3, and T2 form a simple inverter because transistor T5 is off. When $V_{BB}$ reaches a level equal to the threshold voltage of transistor T2, shown by the points E and E' and indicated as the second trigger level $V_{TR2}$, then transistors T3 and T2 go in the off state and transistor T4 charges the voltage $V_B$ at junction point B up to supply voltage $V_{CC}$. Enhancement transistor T5 which turns on helps to cut off transistor T3 and brings the voltage $V_A$ at junction point A to the level $V_{CC} - V_{TE,T5}$ again. It is noted here again that the output voltage is the inverse of the voltage $V_B$ and in this instance drops to ground potential as the voltages $V_A$ and $V_B$ rise to their steady state level. The smaller the size of transistor T4, the closer line E'E is to line F'F.

The occurrence of two trigger levels $V_{TR1}$ and $V_{TR2}$ and their voltage difference is caused by the two different voltage states of enhancement transistor T5 when the input voltage $V_{BB}$ approaches the trigger level from negative and positive voltages respectively.

Figure 3:
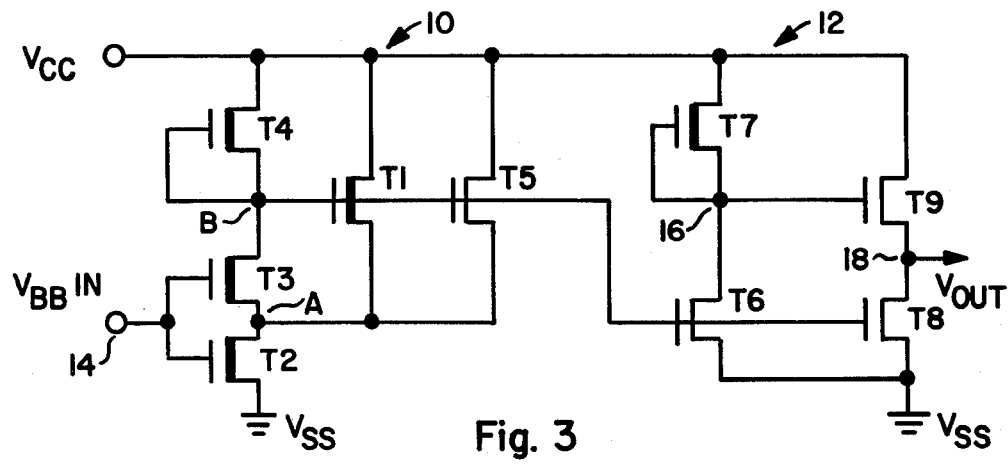
FIG. 3 is a schematic diagram of another embodiment of the MOS power-on reset circuit according to the invention.

The trigger levels $V_{TR1}$ and $V_{TR2}$ of the circuit of FIG. 1 can be shifted in the positive direction by inserting a depletion transistor T1 in parallel with the enhancement transistor T5, and tying their gates together, as shown in FIG. 3. Referring now to the circuit of FIG. 3 and the transfer diagram of FIG. 4, as the input voltage $V_{BB}$ moves along the horizontal axis from a value of negative potential in the direction of positive potential from left to right, then at point C, the voltage $V_A$ at junction point A drops to a low voltage level close to ground potential. At the voltage levels shown at points D and D', the voltage $V_B$ at junction point B will be switched to a low voltage level close to ground potential that is determined by transistors T2 and T1 (and T4 but in this case negligible ) because $V_{BB}-V_{TD,T3}-V_A \geq 0$. This low voltage level of $V_B$ should be below the threshold voltage $V_{TE}$, 6–8 of transistors T6 and T8. Point C and line F'F of curve $V_A$ are at the same horizontal position as in FIG. 2. The trigger level $V_{TR1}$ is determined by the threshold of transistor T3 and the geometries, voltages and thresholds of transistors T2, T5 and also of transistor T1. It is apparent that due to the insertion of transistor T1, the trigger level $V_{TR1}$ is more positive than in the previous embodiment of FIGS. 1 and 2.

Figure 4:
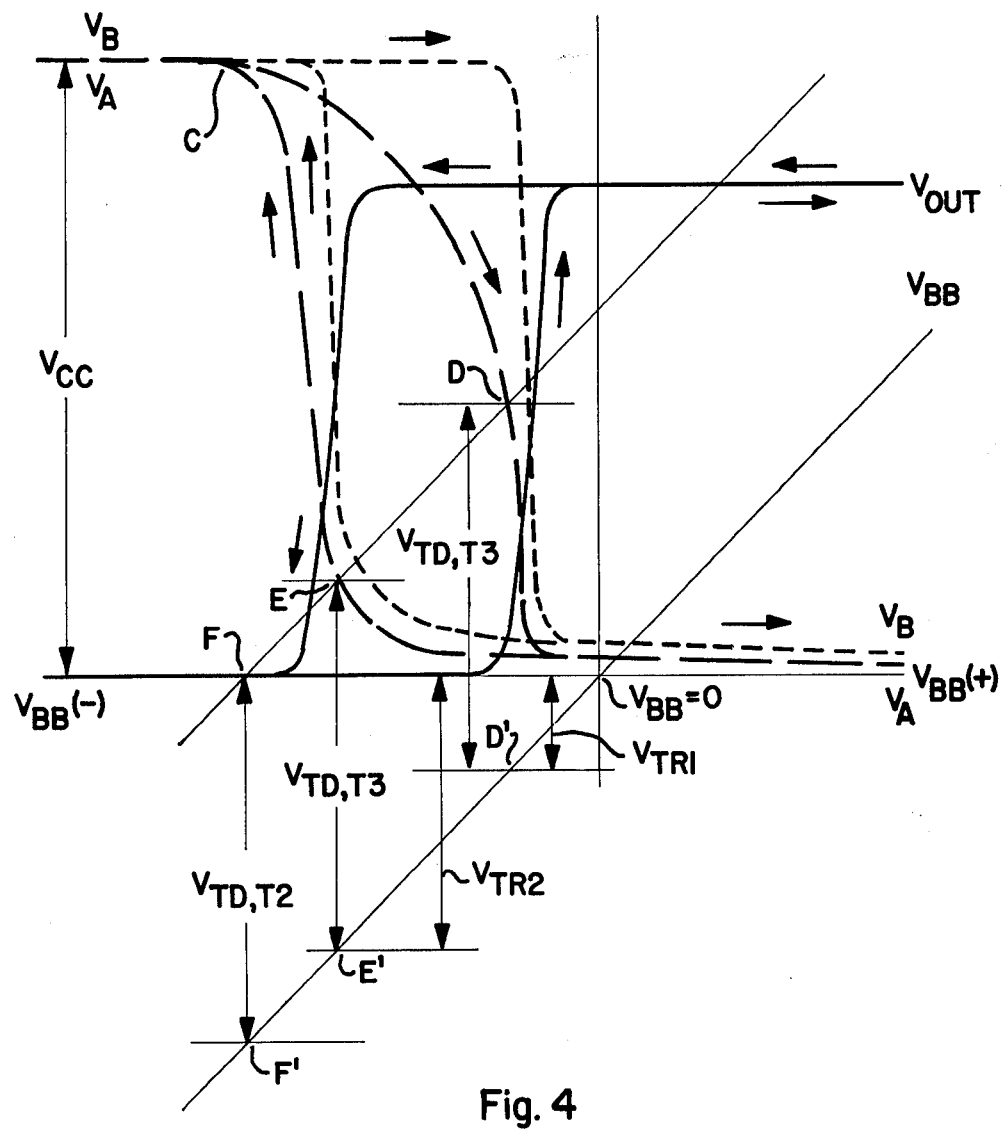
FIG. 4 is a voltage transfer diagram of the circuit of FIG. 3.

Now, as the input voltage $V_{BB}$ makes the reverse excursion from right to left in the diagram of FIG. 4, then at points E and E', $V_{BB}-V_{TD, T3}-V_A \geq 0$. Now, transistor T4 charges $V_B$ up to the supply voltage $V_{CC}$ and transistors T1 and T5 help to switch off transistor T3. The second trigger level $V_{TR2}$ of the input voltage $V_{BB}$ is determined by the threshold of transistor T3 and the voltages and geometries of transistors T2 and T1. Because of the insertion of transistor T1, the trigger level $V_{TR2}$ is also more positive as compared to the embodiment of FIGS. 1 and 2. Enhancement transistor T5 influences the second trigger level $V_{TR2}$ only when at points E and E', at the verge of turn off of transistor T3, $V_B-V_{TE, T5}-V_A \geq 0$.

The occurrence of two trigger levels $V_{TR1}$ and $V_{TR2}$ and their difference in voltages is again caused by the different voltage states of transistors T1 and T5 when the input voltage approaches the trigger level from negative and positive voltages respectively.

FIG. 4 shows clearly the effect of the insertion of depletion transistor T1. Both the trigger levels $V_{TR1}$ and $V_{TR2}$ are shifted to the right, and $V_{BB}$ must be much more positive, relative to FIG. 2, in order to get both $V_A$ and $V_B$ close to ground potential. The shift to the right of trigger level $V_{TR2}$ is larger than the shift to the right of trigger level $V_{TR1}$, because at trigger level $V_{TR1}$ enhancement transistor T5 draws current, and at trigger level $V_{TR2}$ transistor T5 is in the non-conducting state.

The voltage output of the power-on reset circuit can be used to immediately define the input states of major and important MOS-circuit parts thereby preventing the precharge of large N+ diffusion areas in a P type substrate unless the substrate bias voltage has a sufficiently large negative value. This prevents forward biasing of the N+P+ junctions and parasitic N+PN+ field transistors in N channel MOS circuits when power supply voltage $V_{CC}$ is applied before the substrate has a sufficiently large negative value.

Because of the immediate definition of the input states of the major MOS-circuit parts by the voltage output of the power-on reset circuit, large short circuit currents of longer duration can be avoided. When the power-on reset circuit switches, then N+ areas are being precharged. This causes a voltage fluctuation to the positive direction in the input of the power-on reset circuit through capacitive coupling. Now the voltage difference between the two trigger levels prevents the power-on reset circuit from switching again at trigger level $V_{TR1}$ and causing undesired oscillation. Under normal circuit operation, the power-on reset circuit consumes DC power through the first stage of inverter 12 consisting of transistors T6 and T7.

What is claimed is:

1. A reset circuit for providing a reset signal for at least one portion of an integrated circuit containing a semiconductor substrate region at a substrate bias voltage, the reset circuit comprising:
   a pair of like-polarity depletion field-effect transistors, each having a gate responsive to the substrate bias voltage, one of the pair having a channel coupled between a first voltage supply and a first junction point, and the other of the pair having a channel coupled between the first junction point and a second junction point at which an intermediate signal is provided ;
   load means coupled between the second junction point and a second voltage supply;
   a like-polarity enhancement field-effect transistor having a gate coupled to the second junction point and having a channel coupled between the first junction point and the second voltage supply; and
   buffer means responsive to the intermediate signal for generating the reset signal.

2. A circuit as in claim 1 wherein the reset signal changes (a) from a first value to a second value as the substrate bias voltage rises above a first trigger level and (b) from the second value to the first value as the substrate bias voltage drops below a second trigger level less than the first trigger level.

3. A circuit as in claim 1 wherein the buffer means comprises an inverter for producing the reset signal as the inverse of the intermediate signal.

4. A circuit as in claim 3 wherein the load means comprises a like-polarity resistively connected load field-effect transistor having a channel coupled between the second junction point and the second voltage supply.

5. A circuit as in claim 4 wherein the load transistor is a depletion transistor having a gate coupled to the second junction point.

6. A circuit as in claim 4 wherein the load transistor is an enhancement transistor having a gate coupled to the second voltage supply.

7. A circuit as in claim 4 wherein the load transistor is smaller in size than the other transistors.

8. A circuit as in claim 4 further including a like-polarity depletion field-effect transistor having a gate coupled to the second junction point and having a channel coupled between the first junction point and the second voltage supply.

9. A circuit as in claim 4 wherein the transistors are MOS transistors.

10. A circuit as in claim 9 wherein the transistors are N-channel transistors.

11. A circuit as in claim 4 further including means coupling the gates of the pair of depletion transistors to an input terminal for receiving the substrate bias voltage.

12. A circuit as in claim 4 wherein the inverter comprises four field-effect transistors of the same polarity as the other transistors, two of the four being enhancement transistors each having a gate coupled to the second junction point, one of these two having a channel coupled between the first voltage supply and a third junction point, the other of these two having a channel coupled between the first voltage supply and a fourth junction point from which the reset signal is provided, another of the four being a depletion transistor having a gate coupled to the third junction point and having a channel coupled between the third junction point and the second voltage supply, and the last of the four being an enchancement transistor having a gate coupled to the third junction point and having a channel coupled between the fourth junction point and the second voltage supply.

* * * * *